US 9,800,231 B2

(12) United States Patent
Choi

(10) Patent No.: US 9,800,231 B2
(45) Date of Patent: *Oct. 24, 2017

(54) SIGNAL AMPLIFICATION USING A REFERENCE PLANE WITH ALTERNATING IMPEDANCE

(71) Applicant: International Business Machines Corporation, Armonk, NY (US)

(72) Inventor: Jinwoo Choi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/047,692

(22) Filed: Feb. 19, 2016

(65) Prior Publication Data

US 2017/0141772 A1 May 18, 2017

Related U.S. Application Data

(63) Continuation of application No. 14/940,189, filed on Nov. 13, 2015.

(51) Int. Cl.
*H03K 5/02* (2006.01)
*H05K 1/09* (2006.01)
*H03F 1/00* (2006.01)

(52) U.S. Cl.
CPC ..................... *H03K 5/02* (2013.01)

(58) Field of Classification Search
CPC ...... H01L 2924/00; H01L 23/64–23/66; H01L 2924/3025; H05K 1/0236; H05K 2201/09681; H05K 1/09; H01P 1/2005; H03F 1/56; H03F 7/00–7/04; H01Q 15/006; H01Q 15/148

USPC ........................................................ 333/24 R
See application file for complete search history.

(56) References Cited

U.S. PATENT DOCUMENTS

| 5,835,352 | A  | 11/1998 | Matsuzaki et al. |
| 6,930,556 | B2 | 8/2005  | Rutledge et al.  |
| 6,967,282 | B2 | 11/2005 | Tonomura et al.  |
| 7,042,419 | B2 | 5/2006  | Werner et al.    |
| 7,215,301 | B2 | 5/2007  | Choi et al.      |

(Continued)

FOREIGN PATENT DOCUMENTS

EP          0506122 A2    9/1992

OTHER PUBLICATIONS

J. Choi et al, "Noise isolation in mixed-signal systems using alternating impedance electromagnetic bandgap (AI-EBG) structure-based power distribution network (PDN)," IEEE Transactions on Advanced Packaging, vol. 33, No. 1, pp. 2-12, Feb. 2010.

(Continued)

*Primary Examiner* — Dean Takaoka
*Assistant Examiner* — Alan Wong
(74) *Attorney, Agent, or Firm* — Law Office of Jim Boice

(57) ABSTRACT

A method amplifies a signal on a transmission line. A driver transmits an initial signal on a transmission line, which is overlaid on an Alternating Impedance-Electromagnetic BandGap (AI-EBG) structure (i.e., a reference plane) on a circuit board. The AI-EBG structure induces an alternating change to an impedance in the transmission line. The alternating change to the impedance creates a reflection signal to an initial signal on the transmission line, and the reflection signal and the initial signal combine to create an amplified signal.

5 Claims, 5 Drawing Sheets

(56) References Cited

U.S. PATENT DOCUMENTS

| | | |
|---|---|---|
| 7,253,788 B2 | 8/2007 | Choi et al. |
| 7,839,654 B2 | 11/2010 | Choi |
| 8,288,660 B2 | 10/2012 | Kim |
| 8,299,873 B2 | 10/2012 | Wang et al. |
| 8,970,516 B2 | 3/2015 | Black et al. |
| 2013/0265736 A1 | 10/2013 | Rokuhara |

OTHER PUBLICATIONS

J. Choi et al, "A novel electromagnetic bandgap (EBG) structure for mixed-signal system applications," IEEE Radio and Wireless Conference (RAWCON) 2004, Atlanta, Georgia, pp. 243-246, Sep. 2004.

J. Choi, "Alternating impedance electromagnetic bandgap structure for noise isolation in ultra-wide band," Electronics Letters, vol. 42, No. 8, pp. 65-66, Apr. 2006.

J. Choi et al, "Near field and far field analysis of alternating impedance electromagnetic bandgap (AI-EBG) structure for mixed-signal applications," IEEE Transactions on Advanced Packaging, vol. 30, No. 2, pp. 180-190, May 2007.

J. Choi et al, "Noise suppression in ultra wide band (UWB) applications using alternating impedance EBG (AI-EBG) structures," IEEE 35th European Microwave Conference (EuMC), Paris, France, pp. 235-238, Oct. 2005.

J. Choi et al, "Analysis of alternating impedance electromagnetic bandgap (AI-EBG) structure by transmission line network method," IEEE 17th Asia Pacific Microwave Conference (APMC), Suzhou, China, pp. 322-325, Dec. 2005.

J. Choi et al, "Noise reduction and design methodology in mixed-signal systems with alternating impedance electromagnetic bandgap (AI-EBG) structure," IEEE International Microwave Symposium (IMS), Long Beach, California, pp. 849-852, Jun. 2005.

J. Choi et al, "Isolation in mixed-signal systems using a novel electromagnetic bandgap (EBG) structure," IEEE 13th Topical Meeting of Electrical Performance of Electronic Packaging (EPEP), Portland, Oregon, pp. 199-202, Oct. 2004.

J. Choi, "Ultimate noise isolation in high-speed digital systems in packages and printed circuit boards," Electronics Letters, vol. 49, issue 9, pp. 594-U47, Apr. 2013.

Suzanne Lynn Huh et al., "A Design Technique for Embedded Electromagnetic Band Gap Structure in Load Board Applications", IEEE, 2012.

SIGNAL AMPLIFICATION USING A REFERENCE PLANE WITH ALTERNATING IMPEDANCE

BACKGROUND

The present disclosure relates to the field of electronic circuits, and specifically to electronic circuits that carry signals. Still more particularly, the present disclosure relates to amplifying signals using passive amplifiers.

SUMMARY

A method amplifies a signal on a transmission line. A driver transmits an initial signal on a transmission line, which is overlaid on an Alternating Impedance-Electromagnetic BandGap (AI-EBG) structure (i.e., a reference plane) on a circuit board. The AI-EBG structure induces an alternating change to an impedance in the transmission line. The alternating change to the impedance creates a reflection signal to an initial signal on the transmission line, and the reflection signal and the initial signal combine to create an amplified signal.

DETAILED DESCRIPTION

In high-speed digital systems or mixed-signal systems, signal amplification is required for signals being transmitted along transmission lines since transmitted signals attenuate (decay). This signal attenuation is caused by dielectric loss in dielectric materials used in the transmission lines and/or by metal loss related to metal surface roughness of the transmission lines and/or surrounding materials.

In the prior art, powered active amplifiers such as transistors have been employed to amplify signals being transmitted along the transmission lines in such systems. However, powered active amplifiers pose several problems.

First, the complexity of systems (i.e., circuits) that use active amplifiers is increased by the presence of the active amplifiers. This leads to additional cost in manufacturing the circuits.

Second, active amplifiers generate heat, thus requiring additional cooling mechanisms (e.g., fans, heat sinks, etc.) for the system/circuitry, which further increases the complexity and cost of the circuit.

Third, active amplifiers generate their own electronic "noise" (unwanted electronic interference), which induces signal pollution on other transmission lines.

In order to address the problems associated with the use of active amplifiers in amplifying signals on transmission lines in circuits, the present invention presents a novel, elegant, cost-effective, and useful design that uses passive elements to amplify signals being transmitted on transmission lines within a circuit. Specifically, the present invention utilizes Alternating Impedance-Electromagnetic Bandgap (AI-EBG) structures to induce signal amplification by creating additive reflective signals in a transmission line.

Figure 1:
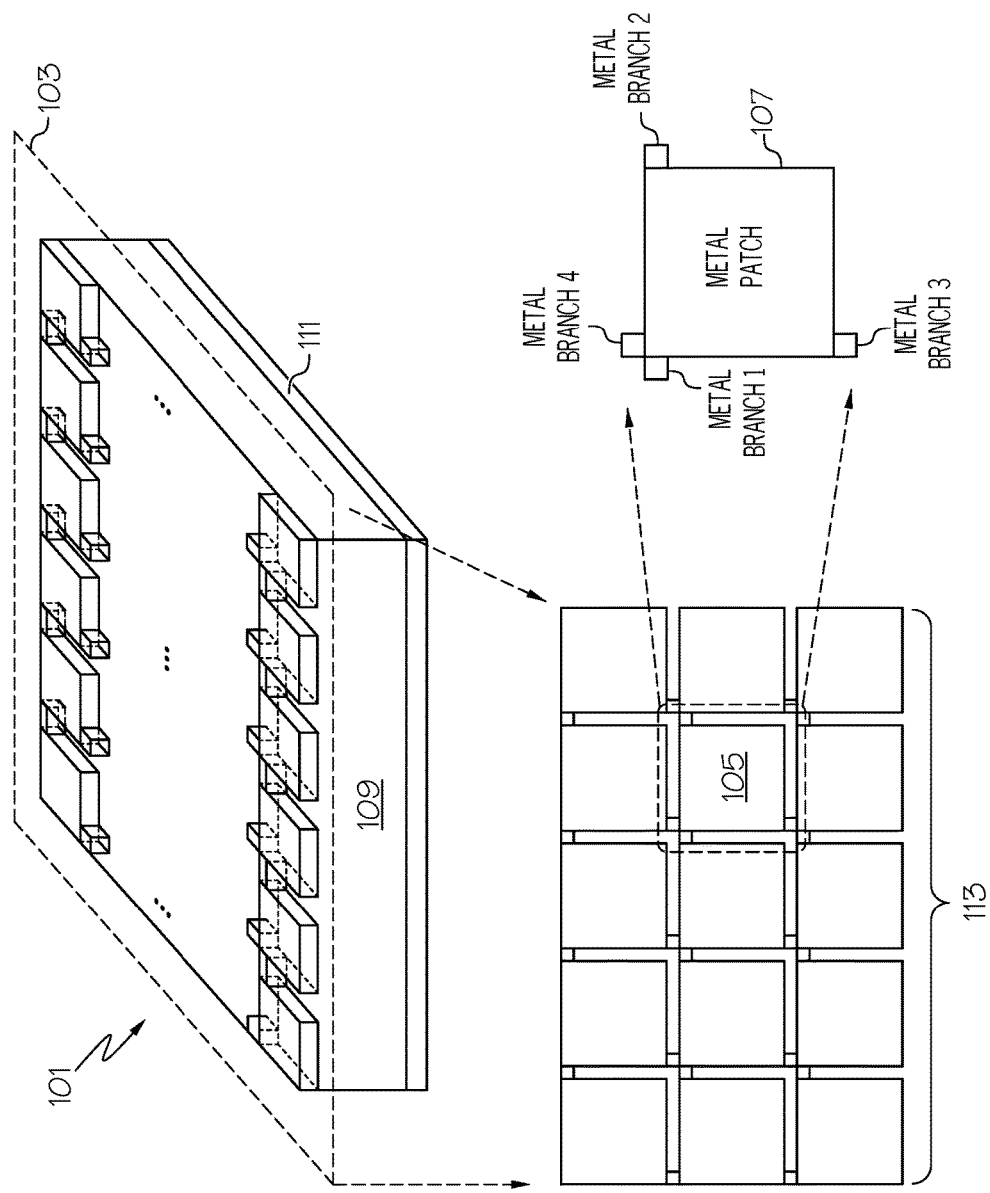
FIG. 1 depicts an exemplary AI-EBG structure used in accordance with one or more embodiments of the present invention.

With reference now to FIG. 1, an exemplary AI-EBG structure 101 as utilized in one or more embodiments of the present invention is presented. As shown in FIG. 1, the AI-EBG structure 101 includes three main components: an AI-EBG layer 103, an insulation layer 109, and a conductor layer 111.

AI-EBG layer 103 (i.e., a reflective plane) includes an AI-EBG unit cell array 113, which is made up of multiple AI-EBG unit cells, such as the AI-EBG unit cell 105 shown in the first expanded view. As depicted in further detail in FIG. 1, each AI-EBG unit cell 105 includes a metal patch 107 and one or more metal branches, depicted in FIG. 1 as metal branches 1-4. As discussed below, metal branches 1-4 in combination with metal patch 107 induce changes to impedances on nearby transmission lines.

Below the AI-EBG layer 103 is insulation layer 109, which in an embodiment is made of FR-4, which is a glass-reinforced epoxy laminate material. That is, FR-4, which is fire resistant (FR) and complies with Underwriters Laboratories standard UL94v-0 (4), is a composite material composed of woven fiberglass cloth that is embedded with an epoxy resin. While FR-4 is an example of insulation material that can be used in insulation layer 109, other dielectric materials may be utilized in insulation layer 109 based on application/design factors.

Below insulation layer 109 is conductor layer 111, which is made of copper or other conducting material, and which supplies voltage to the AI-EBG structure 101 and/or other devices as described herein.

The impedances Z in the metal branches 1-4 shown in FIG. 1 ($Z_{1(branch)}$-$Z_{4(branch)}$) differ from the impedance Z in the metal patch 107 ($Z_{(patch)}$). These differences in impedances Z are the result of metal patch 107 being thicker than metal branches 1-4. For example, the metal branches 1-2 are thinner than metal patch 107 in the AI-EBG unit cell 105 shown in FIG. 2. These different impedances Z cause induced changes to impedances Z on nearby transmission lines, as now described.

Figure 3:
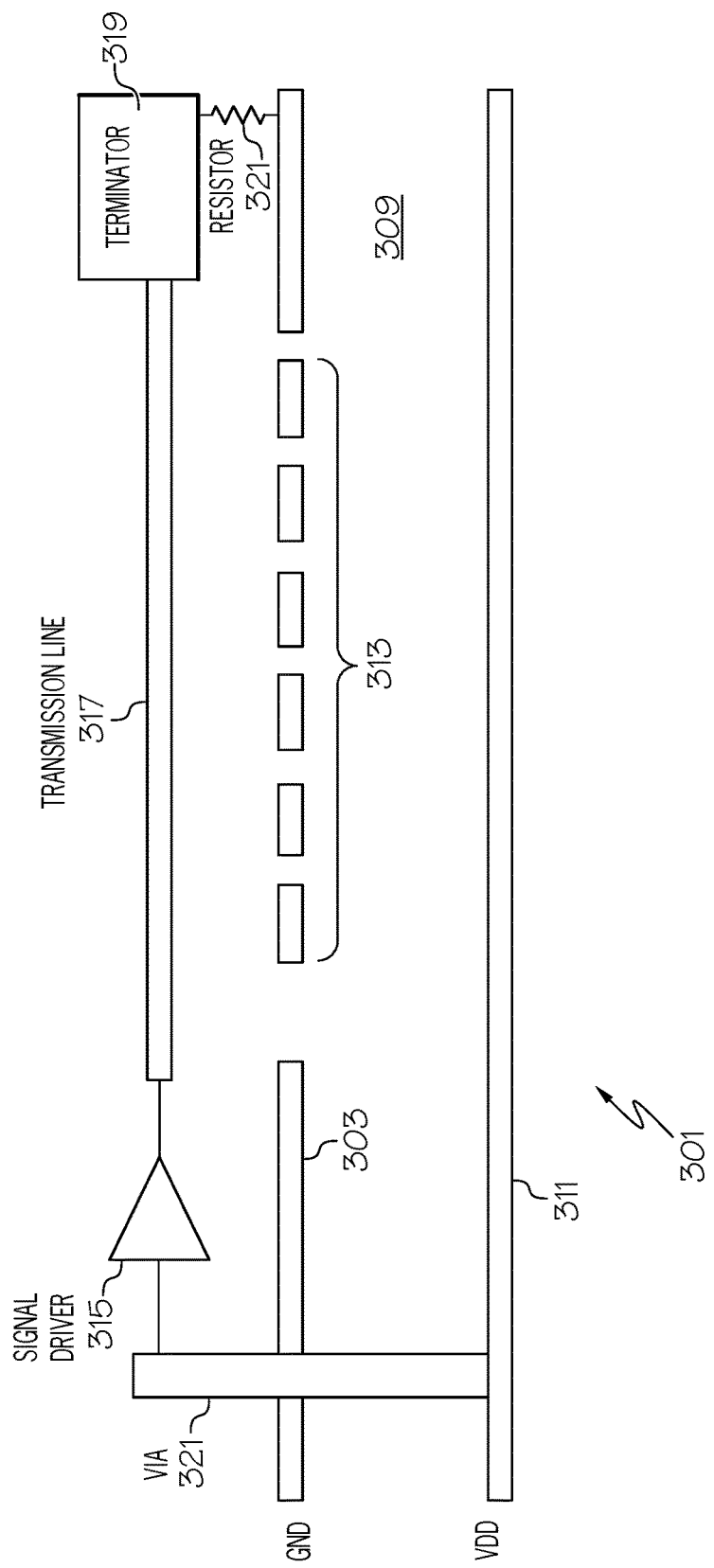
FIG. 3 depicts a transmission line that is overlaid on top of the AI-EBG structure.

With reference now to FIG. 3, a circuit board 301 that embodies one or more of the inventive elements of the present invention is presented. Circuit board 301 includes an AI-EBG layer 303 (analogous to AI-EBG layer 103 shown in FIG. 1), an insulation layer 309 (analogous to insulation layer 109 shown in FIG. 1), and a conductor layer 311 (analogous to conductor layer 111 shown in FIG. 1).

As shown in FIG. 3, AI-EBG layer 303 is connected to ground (GND), and includes an AI-EBG unit cell array 313 (analogous to AI-EBG unit cell array 113 shown in FIG. 1).

A signal driver 315 (e.g., from a digital circuit such as a field programmable gate array—FPGA, etc.) is powered by the voltage (VDD) in conductor layer 311 by a connection supplied by a conducting via, such as the depicted via 321. Via 321 provides an electrical connection from the voltage VDD to the signal driver 315, but is electrically insulated from AI-EBG layer 303 and insulation layer 309.

Signal driver 315 generates and places a signal on transmission line 317, which carries the signal to a terminator 319 (e.g., a receiving sub-circuit, input/output port, etc.), which is coupled to ground by a resistor 321.

The voltage VDD from conductor layer 311 inherently induces a base induced voltage onto AI-EBG layer 303. Due to the different impedances in the metal patches and metal branches described above, varying impedances Z are induced onto transmission line 317, resulting in a voltage bump to the signal being transmitted on the transmission line 317.

To investigate the voltage bump just described, time domain reflectometry (TDR) measurements are taken to measure the characteristic impedance of the transmission line. In a TDR measurement, an injected voltage pulse (e.g., from signal driver 315) propagates down the signal line (e.g., transmission line 317), reflects off the discontinuity (i.e., the change to impedance in the signal line induced by the AI-EBG layer 303), and then returns to form a pulse on the oscilloscope. Each change in characteristic impedance causes the TDR trace to bump up or down to a new impedance level. Increasing impedance implies increased inductance, reduced capacitance, or both, which are induced by the AI-EBG layer 303. Conversely, decreasing impedance implies increased capacitance, reduced inductance, or both, which are induced by the AI-EBG layer 303. These changes in impedance lead to changes in signal voltages, such that the signal amplitude at the far end of the transmission line is bigger than that at the output of the FPGA (driver).

Continue now to assume that a signal propagates from the FPGA to the terminator at the end of transmission line. When a signal passes above a metal branch (in one or more of the AI-EBG unit cells 105 in an AI-EBG unit cell array 113), the TDR trace bumps up. That is, as the signal on transmission line 317 moves above one of the AI-EBG units in AI-EBG unit array 313 in FIG. 3, the initial impedance $Z_1$ of the transmission line 317 changes to impedance $Z_2$. The reflection coefficient formula for this case is given as:

$$\Gamma = \frac{v_n^-}{v_n^+} = \frac{Z_{o,n+1} - Z_{o,n}}{Z_{o,n+1} + Z_{o,n}}$$

where $\Gamma$ is a reflection coefficient, $V_n^+$ is a voltage traveling in positive direction at nth transmission line, $v_n^-$ is a voltage traveling in negative direction at nth transmission line, $Z_{o,n}$ is a characteristic impedance at nth transmission line, and $Z_{o,n+1}$ is a characteristic impedance at (n+1)th transmission line.

Since $Z_2 > Z_1$ in this case, the reflected wave is a positive copy of the incident wave. The incident and reflected waves superimpose. The voltage is continuous at the discontinuity, so the signal continues onto the second transmission line with peak amplitude based on the total voltage on the first line. When the incident and reflected waves have the same sign, they add, and the voltage signal on the second transmission is larger. This situation continues when an injected signal passes over a metal branch in a gap. This is because periodic gaps in AI-EBG structure make discontinuities in impedance profile and these discontinuities make reflection coefficient positive.

Figure 4:
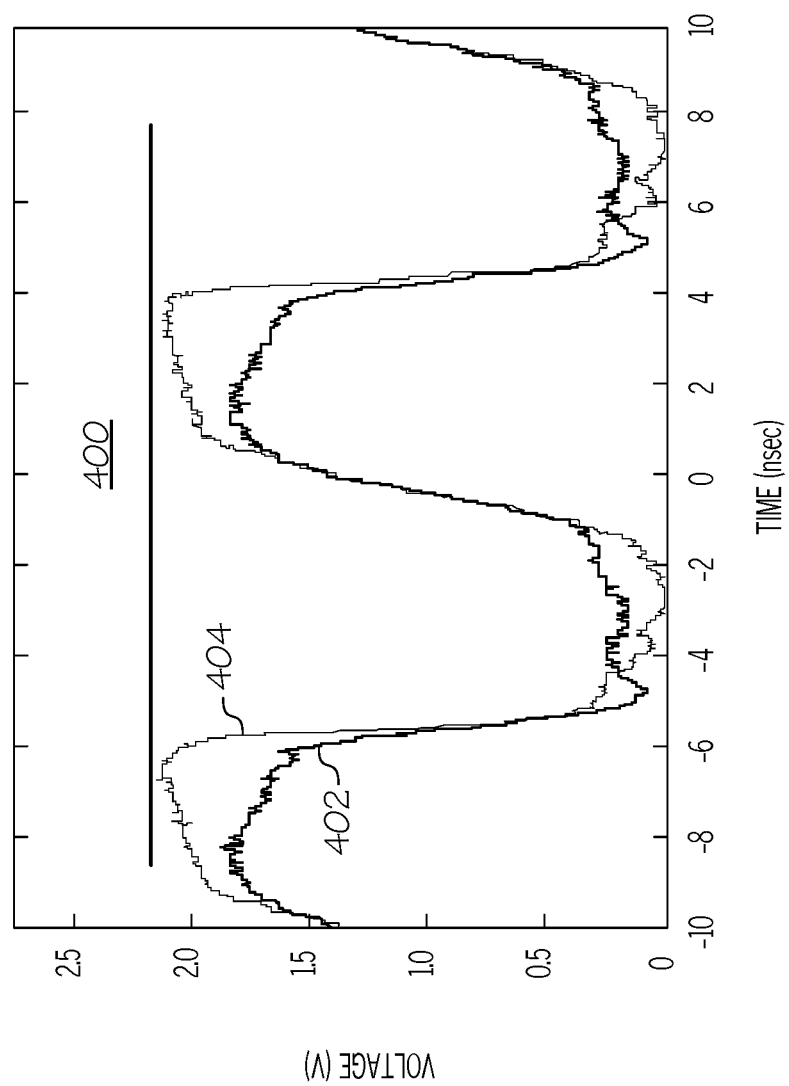
FIG. 4 illustrates a signal amplification induced by the AI-EBG structure according to measured test results by the present inventor.

As shown in graph 400 in FIG. 4, the voltage of the signal as it left the signal driver 315 in FIG. 3 is depicted as line 402. However, the voltage of the signal as it arrived at terminator 319 is depicted as line 404. The voltage "bump" is the result of a combination of initial signals and reflected signals caused by changes to impedance in the transmission line 317. Note that this voltage amplification/bump is entirely passive, and does not require any additional drivers, amplifiers, etc.

Figure 2:
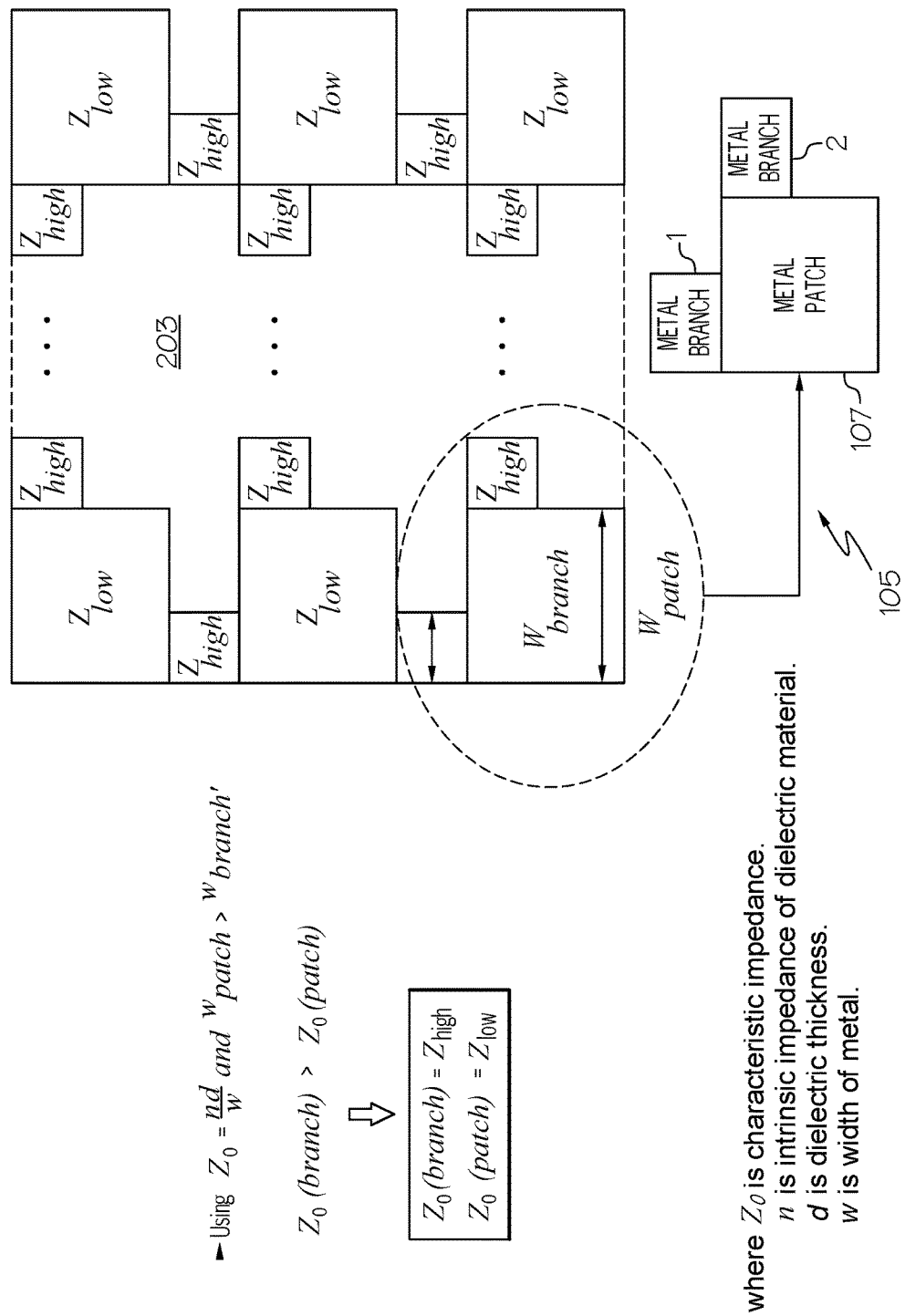
FIG. 2 illustrates various impedances in components of AI-EBG unit cells in an AI-EBG layer.

Note that the electronic structure depicted in FIGS. 1-3 may be a component of a larger device, such as a vehicle (e.g., automobile, truck, aircraft, watercraft, etc.), an appliance (e.g., a refrigerator, a washing machine, etc.), manufacturing equipment (e.g., a computer numerical control—CNC machine), etc.

Figure 5:
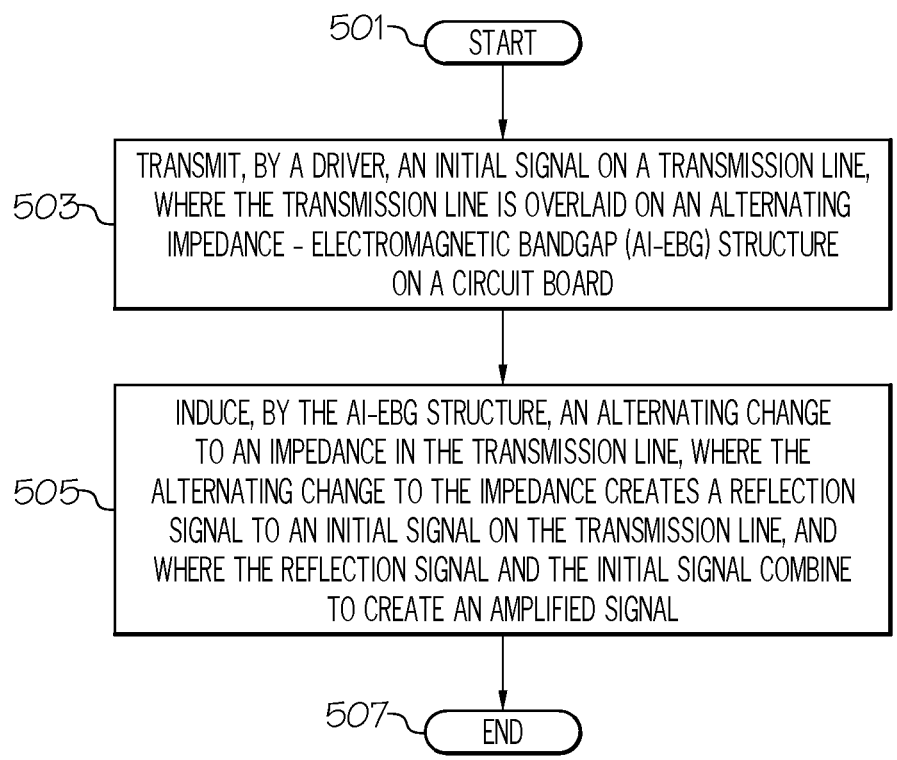
FIG. 5 is a high level flow chart of one or more steps performed by one or more hardware devices to amplify a signal using an AI-EBG structure.

With reference now to FIG. 5, a high level flow chart of one or more steps performed by one or more hardware devices in an AI-EBG structure to amplify a signal traveling on a transmission line is presented.

After initiator block 501, a driver (e.g., signal driver 315 shown in FIG. 3) transmits an initial signal on a transmission line (e.g., transmission line 317 in FIG. 3), as described in block 503. As depicted in FIG. 3, the transmission line is overlaid on an Alternating Impedance-Electromagnetic BandGap (AI-EBG) structure on a circuit board. That is, the AI-EBG structure 301 shown in FIG. 3 is part of a circuit board. Overlaid on top of the AI-EBG structure 301 are one or more transmission lines, such as transmission line 317 shown in FIG. 3.

As described in block 505 in FIG. 5, the AI-EBG structure induces an alternating change to an impedance in the transmission line. The alternating change to the impedance creates a reflection signal to an initial signal on the transmission line. The reflection signal and the initial signal combine to create an amplified signal, as described herein.

The flow chart ends at terminator block 507.

Any methods described in the present disclosure may be implemented through the use of a VHDL (VHSIC Hardware Description Language) program and a VHDL chip. VHDL is an exemplary design-entry language for Field Programmable Gate Arrays (FPGAs), Application Specific Integrated Circuits (ASICs), and other similar electronic devices. Thus, any software-implemented method described herein may be emulated by a hardware-based VHDL program, which is then applied to a VHDL chip, such as a FPGA.

Having thus described embodiments of the present invention of the present application in detail and by reference to illustrative embodiments thereof, it will be apparent that modifications and variations are possible without departing from the scope of the present invention defined in the appended claims.

What is claimed is:

1. A method for amplifying a signal on a transmission line, the method comprising:
   transmitting, by a driver, an initial signal on a transmission line, wherein the transmission line is overlaid on an Alternating Impedance - Electromagnetic BandGap (AI-EBG) structure on a circuit board; and
   inducing, by the AI-EBG structure, an alternating change to an impedance in the transmission line, wherein the alternating change to the impedance creates a reflection signal to an initial signal on the transmission line, and wherein the reflection signal and the initial signal combine to create an amplified signal.

2. The method of claim 1, wherein the transmission line is in an electronic structure that comprises a conductor layer, an insulation layer adjacent to the conductor layer, an Alternating Impedance Electromagnetic Bandgap (AI-EBG) layer adjacent to the conductor layer, and a signal driver, the transmission line, and a destination device overlaid on the AI-EBG layer, wherein the AI-EBG structure is the AI-EBG layer.

3. The method of claim 2, wherein the AI-EBG layer comprises:
   an AI-EBG unit cell array of AI-EBG unit cells, wherein each AI-EBG unit cell comprises a metal patch having a first thickness and one or more metal branches having a second thickness, wherein the one or more metal branches extend away from the metal patch, and wherein the first thickness of the metal patch is greater than the second thickness of the one or more metal branches.

4. The method of claim 2, further comprising:

connecting a ground to the AI-EBG layer; and connecting a terminator to the AI-EBG layer and the ground.

5. The method of claim 2, further comprising:

connecting a power source to the conductor layer; and electrically insulating the AI-EBG layer and the insulation layer from the power source by a conducting via through the AI-EBG layer and the insulation layer, wherein the conducting via electrically couples the power source to the signal driver.

* * * * *